Feb. 6, 1951 C. F. WEILAND 2,540,702

BANDSPREAD AND SCALE EQUALIZING RESISTANCE-CAPACITANCE TUNING CIRCUIT

Filed Oct. 21, 1949 2 Sheets-Sheet 1

INVENTOR.

Christian F. Weiland

BY

Robert S. Dunham

ATTORNEY

INVENTOR.
Christian F. Weiland
BY
Robert S. Dunham
ATTORNEY

Patented Feb. 6, 1951

2,540,702

UNITED STATES PATENT OFFICE 2,540,702

BANDSPREAD AND SCALE EQUALIZING RESISTANCE-CAPACITANCE TUNING CIRCUIT

Christian F. Weiland, New York, N. Y.

Application October 21, 1949, Serial No. 122,696

18 Claims. (Cl. 250—40)

This invention relates to a resistance-capacitance band spread tuning unit for oscillators and like electrical apparatus and particularly to an improved band spread tuning unit for audio oscillators, frequency bridges and like apparatus.

This invention may generally be described as an improved resistance-capacitance band spread tuning unit for oscillators and like electrical apparatus made up of a plurality of particularly arranged circuit elements whose values and functioning bear a predetermined relationship to each other; and incorporating means for preselecting the frequency coverage of a tuning dial so that an enlarged, uncrowded, continuous and preferably decade type tuning scale made up of a plurality of subscales may be utilized for directly indicating the frequency range.

An object of this invention is to provide an improved band spread tuning unit incorporating and utilizing an enlarged and continuous decade type tuning scale.

A further object of this invention is to provide an improved band spread tuning unit which provides increased precision in calibration and in reading of the scale.

Still another object of this invention is to provide an improved band spread tuning unit having a decade type tuning scale made up of three subscales having a predetermined and continuous relationship between their respective frequency coverages.

Another and further object of the invention is to provide an improved resistance-capacitance band spread tuning unit that will avoid undue repetition of the same frequency readings on the subscales, so that the space occupied by the subscales is utilized to the utmost extent.

An additional object of this invention is to provide a resistance-capacitance band spread tuning unit having three tuning subscales positioned so that the highest reading on the first of the three subscales coincides with the lowest reading on the second subscale, and so that the highest reading on the second subscale coincides with the lowest reading on the third subscale, and including means whereby the frequency spectrum represented by the entire scale may be continually swept by traversing the first subscale in one direction, the second subscale in an opposite direction, and the third subscale in the direction parallel to that used in traversing the first subscale, thus eliminating lost motion in tuning the entire decade scale.

Still another object of the invention is to provide in a resistance-capacitance tuning unit means by which a predetermined amount of control may be exercised on the distribution of the frequency coverage over the three subscales in such a manner that the frequency range represented by one or two subscales may be increased or decreased, thus decreasing or increasing the number of divisions on the remaining subscale or subscales.

Referring to the drawings.

Figures 1, 2:
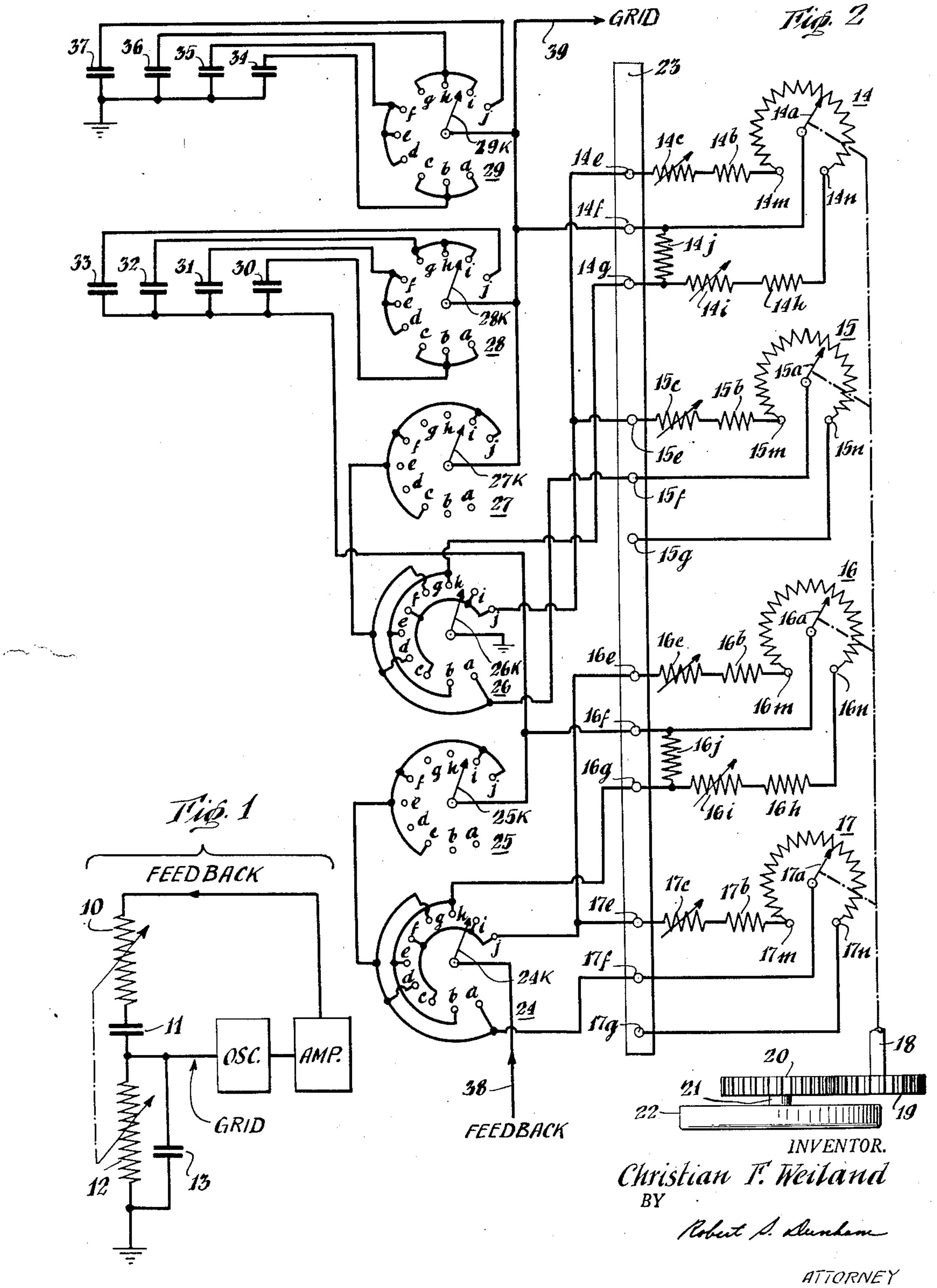
Fig. 1 is a schematic representation of a conventional tuning unit for a Wien bridge oscillator or conventional R-C audio oscillator.
Fig. 2 is a schematic circuit diagram of a presently preferred embodiment of the improved band spread tuning unit.

Fig. 1 schematically illustrates a basic tuning circuit of a conventional Wien bridge or R-C audio oscillator. The tunable impedances include variable resistors 10 and 12 connected in series between the amplifier feed-back circuit and ground. A fixed impedance, such as the condenser 11, is included in the series circuit intermediate the resistors 10 and 12. The resistor 12 is paralleled by another fixed impedance, such as the condenser 13. The condensers 11 and 13 and the resistors 10 and 12 are usually chosen to be equal in their respective capacitance and resistance values.

The output of the tuning network is fed to the grid of an oscillator tube as schematically represented together with an adjacent amplifier stage in Fig. 1. In the conventional circuit, therein illustrated, it is the usual practice to have a certain portion of the resistors fixed in value so as to permit the use of a common tuning scale. This tuning scale may, for example, cover 15 to 150, 150 to 1500, and 1500 to 15,000 cycles per second. If such a scale is marked from 15 to 150, it is, of course, necessary to employ multipliers of 1, 10 and 100 to cover an audio frequency spectrum from 15 to 15,000 cycles per second.

The conventional audio oscillators usually have a large range of frequencies spread over their scale or over each one of their scales if they have more than one, and unless special precautions are taken, such as, for example, using specially tapered variable tuning resistors (or tuning condensers with specially shaped rotor blades, if variable condensers are utilized), excessive crowding may be expected at the high frequency ends of the scale or scales. This crowding makes accurate reading within reasonable tolerances extremely difficult and precision tuning normally will require careful calibration.

Figure 4:
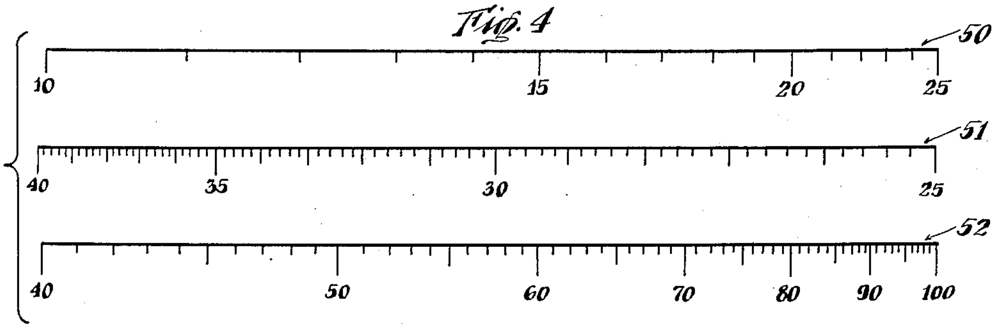
Fig. 4 is a representation of an enlarged decade type tuning scale illustrating the three subscales for use with the circuit set forth in Fig. 2.

Fig. 2 is a schematic circuit diagram of one version of the presently preferred embodiment of the improved band spread tuning unit, for use with a decade type scale made up of three subscales, incorporating means for equalizing the frequency values at the high frequency end of the first subscale and the low frequency end of the intermediate subscale; and for equalizing the frequency values at the high frequency end of the intermediate subscale and the low frequency end of the third subscale as clearly illustrated in the decade type scale in Fig. 4.

Variable tuning within a predetermined frequency range is provided by two tuning circuits each including a pair of variable potentiometers, such as the pairs of potentiometers 14, 15 and 16, 17. The potentiometers 14, 15, 16 and 17 are constructed so as to have equivalent resistance values and equivalent angles of rotation required for turning the rotatable tuning arms 14*a*, 15*a*, 16*a* and 17*a* from their furthermost clockwise position in the vicinity of the terminals 14*n*, 15*n*, 16*n*, 17*n*, respectively, to their furthermost counterclockwise position in the vicinity of the terminals 14*m*, 15*m*, 16*m* and 17*m*, respectively. Potentiometers 14 and 15 form a pair of tuning resistances, as do potentiometers 16 and 17. Each of these pairs is instrumental in the tuning of its respective circuit.

As shown in Fig. 2, by way of example only, the potentiometers 14, 15, 16 and 17 are ganged together on a single shaft 18. Rigidly mounted on one end of the shaft 18 is a gear 19. The gear 19 is engaged and driven by a gear 20, which is mounted on a separate shaft 21. The shaft 21 is manually rotated by an external tuning control such as that shown at 22. Turning the tuning control 22 rotates the gear 20, which in turn counter-rotates the gear 19 and the shaft 18. If desired, however, the potentiometers could be coupled in pairs, i. e., 14 and 15, 16 and 17, each with their own shaft and gearing arrangement.

In the presently preferred embodiment of the invention, as illustrated in Fig. 2, the potentiometers utilized are such that the potentiometer arms 14*a*, 15*a*, 16*a* and 17*a* may be rotated through an angle of approximately 300°. Any desired angle of rotation, however, for the potentiometer arms 14*a* through 17*a* may be obtained from any suitable drive for the shaft 18, either of the direct drive or vernier type, permitting the use of arc type scales or straight scales, as the case may be.

It is desirable in utilizing potentiometers such as 14 through 17, that a convenient percentage, such as, for example, ten percent, of the total potentiometer resistance value not be used for variable tuning. Consequently, if potentiometers with a 300 degree swing are used, it follows, in the example stated, that 30 degrees of this swing will not be used for variable tuning purposes. If, for example, the total resistance of each of the potentiometers 14 through 17 is 20,000 ohms, and assuming the potentiometer has linear characteristics, it is evident that only 90 per cent of the total resistance, or 18,000 ohms, will be used for variable tuning purposes. The gearing may then be so arranged that the potentiometer arms 14*a* through 17*a* will, in the extreme counter-clockwise rotative position, be spaced 15 degrees from the extreme counter-clockwise terminals 14*m* through 17*m* of the potentiometers 14 through 17. The portion not traversed by the potentiometer arms 14*a* through 17*a* at the extrreme counter-clockwise portion, i. e., adjacent the terminals 14*m* through 17*m* respectively, appears as a fixed resistance in each of the tuning circuits which in this case will have a value of 1000 ohms. When the gearing is thus arranged, the arms 14*a* through 17*a* also will, in the extreme clockwise position be spaced 15 degrees from the extreme clockwise terminals 14*n* through 17*n*, respectively. If the potentiometers utilized are of linear characteristics, it is immaterial whether these inactive resistances appearing at the beginning and the end of the tuning path of each of the arms 14*a* through 17*a* be one-half of the total unused resistance or any other specific portion thereof or even that they be exactly equal in value. A purpose of introducing these unused portions of the total potentiometer resistance is to keep the movable potentiometer arms 14*a* through 17*a* a sufficient distance apart from the terminals of the potentiometers 14 through 17, respectively, to prevent overriding of the potentiometer terminals 14*m* through 17*m* and 14*n* through 17*n*. Overriding of the potentiometer terminals would upset the calibration of the ends of the scales.

If other than straight line resistance potentiometers are used, care must be taken that the unused resistance adjacent the potentiometer terminals are of equal or at least very near equal value and therefore of equal increment. In other words, if specially tapered potentiometers are used for tuning purposes, they must be accurately ganged and aligned and should remain so during the operative life of the unit. If the ganging or alignment of these tuning potentiometers is changed, the original scale calibration will be materially affected.

Connected in series between each of the terminals 14*m* through 17*m* of the potentiometers 14 through 17 and the terminals 14*e* through 17*e* on the terminals strip 23, respectively, are fixed resistors 14*b* through 17*b*, respectively, and variable resistors 14*c* through 17*c*, respectively. The fixed resistors 14*b* through 17*b* and variable resistors 14*c* through 17*c* are approximately equivalent in their nominal resistance values. The latter function as equalizers or adjusters to the fixed resistance in the tuning circuits.

Connected in series between each of the extreme clockwise terminals 14*n* and 16*n* of the potentiometers 14 and 16 and the terminals 14*g* and 16*g* on the terminal strip 23, respectively, are fixed resistors 14*h* and 16*h*, respectively, with their variable or adjusting resistors 14*i* and 16*i*, respectively.

The movable arms 14*a* through 17*a* of the potentiometers are directly connected to the terminals 14*f* through 17*f*, respectively, on the terminal strip 23. Connected between the movable arms 14*a* and 16*a*, and the terminals 14*g* and 16*g*, respectively, are shunt resistors 14*j* and 16*j*.

For the purposes of convenience, and for clarity of explanation, the term "potentiometer resistance circuit" will be understood to include any portion of any of the potentiometers 14 through 17 that is momentarily or permanently in the circuit for tuning purposes plus their accompanying fixed and adjusting resistors. To identify any particular "potentiometer resistance circuit," the term will be followed by the numerical reference characters representing the particular terminals on the terminal strip 23 associated with said resistance circuit. For example, the potentiometer resistance circuit including adjusting resistor 14c, fixed resistor 14b, and the portion of the potentiometer 14 included between the terminal 14m and the movable arm 14a, will be identified by the term "potentiometer resistance circuit between terminals 14e and 14f." Similarly, the potentiometer resistance circuit including adjusting resistor 14i, fixed resistor 14h, and the portion of the potentiometer between the terminal 14n and the movable arm 14a and the shunt resistor 14j will be identified by the term "potentiometer resistance circuit between terminals 14f and 14g."

As illustrated in Fig. 2, each of the potentiometer terminals 14m through 17m is connected to a separate terminal such as 14e, 15e, 16e and 17e, respectively, on the terminal strip 23 through the adjusting resistors 14c through 17c, respectively, and the fixed resistors 14b through 17b, respectively. The movable arms 14a through 17a are individually and directly connected to individual terminals 14f through 17f, respectively, on said terminal strip 23. The terminals 14n and 16n are connected to terminals 14g and 16g on said strip 23 through resistors 14h, 14i and 16h and 16i, respectively. The terminals 15n and 17n are directly connected to terminals 15g and 17g on said terminal strip 23.

The terminal strip 23 is introduced to provide for convenient connecting points and as a means for measuring the fixed resistance and alignment values for each of the potentiometer circuits 14 through 17; otherwise it is of incidental merit only, and for some applications may take any other relative position in the circuit to suit conditions, or even be omitted without in the least affecting the operation of the band spread tuner.

The potentiometers 14 through 17 are connected via their various respective terminals on the terminal strip 23, to four decks 24 through 27 of a six-deck, ten-position or ten-circuit selector switch. For the purpose of convenience, the 10 switch points on each of the switch decks will be lettered from a to j, inclusive, and when referring to any specific switch point on any of the switch decks, the reference numeral will refer to the specific switch deck and the following letter to the specific switch point on said switch deck. The switch points on the switch decks 24 and 26 are interconnected in a like manner. The switch points on the switch decks 25 and 27 are also interconnected in a like manner. The switch decks 24 and 25 function in conjunction with the potentiometers 16 and 17, and the switch decks 26 and 27 function in conjunction with the potentiometers 14 and 15.

The remaining two decks of the six-deck selector switch are numbered 28 and 29. In conformity with the above described system of identification, the switch points again will be referred to by the letters a through j inclusive, and when referring to any specific switch point on a specific switch deck, the numerical reference will refer to the specific switch deck and the following letter to the specific switch point on said switch deck. The switch decks 28 and 29 are wired in a like manner and are connected as shown to two sets of four condensers 30 through 33, and 34 through 37, respectively. The condensers 30 through 33, and the condensers 34 through 37 are the tuning condensers for the tuning unit. Condenser 30 is equal in capacity to condenser 34, condenser 31 is equal in capacity to condenser 35, condenser 32 is equal in capacity to condenser 36, and condenser 33 is equal in capacity to condenser 37.

The movable arms of the six-deck selector switch will be identified by the letter k in each of the switch decks, and when any specific movable arm is referred to, the switch deck numeral will be followed by the letter k. The movable arms 24k through 29k are ganged on a common switching shaft which may be manually operated by a suitable handle or knob on the front of the tuning unit housing. In rotating this common shaft, the switch arms 24k through 29k are thus rotated in alignment. In order to prevent the cessation of oscillation when switching from one switch point to another, it is preferred that the switching arms 24k through 29k be of the "shorting" type, i. e., the type that contacts or engages the next succeeding switch point before breaking contact with the preceding one.

In examining the connections shown in Fig. 2 between the potentiometers 14 through 17 and their associated resistances, the decks 24 through 29 of the six-deck selector switch, and the condensers 30 through 33, 34 through 37, it is seen that when the switch arms 24k to 29k are in contact with the switch point a on the decks 24 through 29, the potentiometer resistance circuits between terminals 17e and 17f and 16e and 16f are connected in series with each other, the potentiometer resistance circuits between terminals 15e and 15f, and 14e and 14f are also connected in series via the switch decks 26 and 27, and the condensers 30 and 34 are included in the tuning circuit.

The above series connection of the potentiometers is established wherever the movable switch arms 24k through 27k are in contact with the switch points 24a through 27a, 24d through 27d, and 24g through 27g.

Figure 3:
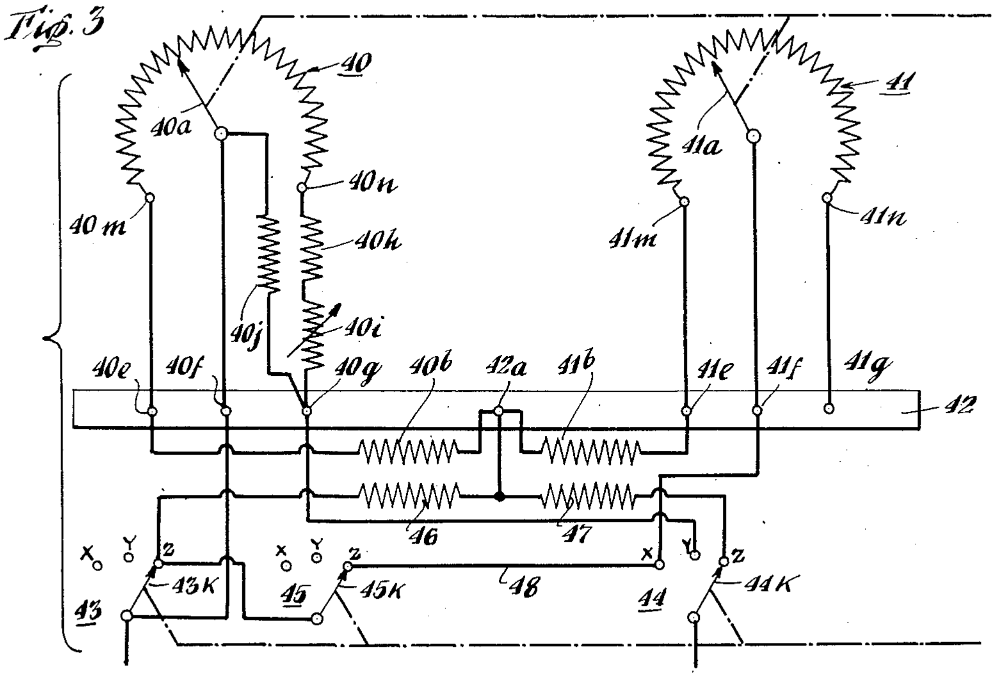
Fig. 3 is a circuit diagram of a portion of an alternative resistance tuning circuit.

The above series arrangement provides the maximum possible resistance available for tuning purposes. It will be noted that when the movable arms 14a through 17a of the potentiometers 14 through 17 are positioned adjacent the terminals 14n through 17n, said resistance tuning circuits are positioned to correspond to the lowest possible frequency, using condensers 30 and 34, for example, such as that illustrated on subscale 50 of Fig. 3. If the tuning dial 22 is rotated to move shaft 21 in a clockwise manner to provide for ascending frequency tuning, the movable arms 14a through 17a rotate in a counter-clockwise direction, thus decreasing the resistance present in the potentiometer resistance circuits. The frequency range of scale 50 of Fig. 3 is traversed in the ascending frequency direction by moving the potentiometer arms 14a through 17a counter-clockwise from positions adjacent terminals 14n through 17n, respectively, to positions adjacent terminals 14m through 17m, respectively.

When the switching arms 24k through 27k are in contact with the switch points 24c through 27c, the potentiometer resistance circuit between terminals 17e and 17f is paralleled by the potentiometer resistance circuit between terminals 16e and 16f through switch points 24c and 25c. In a similar manner the potentiometer resistance circuit between the terminals 15e and 15f is paralleled by the potentiometer resistance circuit between the terminals 14e and 14f through switch points 26c and 27c. This parallel connection is formed whenever the switching arms 24k through 27k are in contact with the switch points 24c through 27c, 24f through 27f and 24i through 27i.

The above described parallel arrangement provides the minimum resistance available for tuning purposes. It should be noted that when the movable arms 14a through 17a of the potentiometers 14 through 17 are positioned adjacent the terminals 14m through 17m, said resistance tuning circuits are positioned to correspond to the maximum possible frequency, using condensers 30 and 34, for example, such as that indicated on subscale 52 of Fig. 3. As was the frequency range of scale 50, the frequency range of scale 52 of Fig. 3 is traversed in ascending frequency direction by moving the potentiometer arms 14a through 17a counter-clockwise from positions adjacent the terminals 14n through 17n, respectively, toward positions adjacent terminals 14m through 17m, respectively.

The tuning condensers 30 through 33 and 34 through 37 are introduced into the circuit through the switch decks 28 and 29. When the movable arms 28k and 29k are on switch points *a*, *b* or *c*, condensers 30 and 34 are included in the tuning circuit. When the movable arms 28k and 29k are on the switch points *d*, *e* or *f*, condensers 31 and 35 are included in the tuning circuit, and when the movable arms 28k and 29k are in contact with the switch points *g*, *h* or *i*, condensers 32 and 36 are included in the tuning circuit.

In any one of the above examples, the effective tuning resistance for any position of the potentiometer arms 14a through 17a will appear between the movable switching arms governing the switching of the respective circuits. For example, for potentiometers 16 and 17 it will appear between the movable arms 24k and 25k of the switch decks 24 and 25, and for the potentiometers 14 and 15 it will appear between the switch arms 26k and 27k of the switch decks 26 and 27. The above switching arrangement provides that the effective tuning resistance in the *a*, *d* and *g* positions of the six-deck selector switch is always four times the resistance for that of the *c*, *f*, and *i* positions.

The switch points in the switch deck 28 are connected so that when the movable arm 28k is in the *a*, *b* or *c* position, the condenser 30 is placed in series with the potentiometer resistance circuits 16 and 17. As described above, the switch deck 29 is similarly connected so that the condenser 34 is placed in parallel to the arrangements of the potentiometer circuits 14 and 15 as determined by the *a*, *b* and *c* switching positions.

Furthermore, the combination of the condenser 30 with the potentiometers 16 and 17 in any one of the two switching arrangements above described, i. e., series or parallel, will be a series combination. Condenser 34 will be placed in parallel at the same time to corresponding switching arrangements of the potentiometers 14 and 15. When switch arms 28k and 29k are in contact with switch points *d*, *e* and *f*, condensers 31 and 35 are included in the tuning circuit. Likewise, when switch arms 28k and 29k are in contact with switch points *g*, *h* and *i*, condensers 32 and 36 are included in the tuning circuit and when the switch arms 28k and 29k are in contact with switch points *j*, condensers 33 and 37 are included in the circuit.

In the embodiment shown in the drawings, a lead 38 is brought out to serve as a connector to an amplifier feed-back, and is so labeled in the drawing. Another lead 39 is brought out to serve as a connector to an oscillator grid, and is so labeled on the drawing. These leads 38 and 39 are utilized to connect the band spread tuning unit to a system such as that shown schematically in Fig. 1, however, it should be clearly understood that the invention is not limited in its application to audio oscillators.

A careful selection of values of the fixed resistors 14b to 17b and the equalizing variable resistors 14c through 17c provides that the fixed resistance in each of the potentiometer resistance circuits can be made equal by adjusting the equalizing resistors 14c through 17c.

In the preferred embodiments of the invention as illustrated in the drawings, the resonant frequency of the tuning circuit is inversely proportional to the amount of tuning resistance contained therein. Therefore, in covering a predetermined frequency spectrum, the ratio of maximum to minimum tuning resistance present in the tuning circuit must be equal to the ratio of the highest frequency to the lowest frequency bounding said predetermined frequency spectrum. The ratio of the maximum to minimum tuning resistances, in the embodiment illustrated in the drawings, is equal to the ratio between the sum of the fixed and variable resistance of each potentiometer resistance circuit to the fixed or minimum resistance of each potentiometer resistance circuit. Therefore, in order to provide a direct reading scale such as subscales 50 and 52 of Fig. 4, the fixed resistance present in each of the potentiometer resistance circuits should be made to represent two-fifths of the total resistance in the circuit or two-thirds of the resistance of the variable portion of each of the potentiometers 14 through 17. Stated in other words, the tuning resistance for any one of the two possible switching arrangements, i. e., series or parallel, at the minimum frequency position is 2½ times greater than the tuning resistance for the maximum frequency position. The swing between the frequency readings is governed by the maximum and minimum resistance settings of the potentiometer arms 14a through 17a. In the example given above, with respect to scale 50 of Fig. 4, the variable resistance portion of the potentiometers comprises 18,000 ohms. The fixed resistance therefore will be two-thirds of this value or 12,000 ohms for each potentiometer. The maximum tuning resistance will be two times 30,000 ohms in series or 60,000 ohms and the minimum tuning resistance will be twice 12,000 ohms or 24,000 ohms. Similarly, for scale 52 of Fig. 4, the maximum resistance is ¼ of 60,000 ohms or 15,000 ohms and the minimum resistance is ¼ of 24,000 ohms or 6,000 ohms.

If, for example, the frequency for the first selector switch position, i. e., switch point *a*, was preselected to be 10 cycles per second, then frequencies covered by the *a* position on the six-deck selector switch will cover a range from 1 to 2.5 times the minimum frequency. This results in the highest frequency reading on a subscale covered by the switch point *a* to be 2.5 times the minimum frequency reading, or in this example, 25. This scale is illustrated as scale 50 on Fig. 4.

If the movable arms 24k through 29k are advanced to switch point *c*, the tuning resistance present in the circuit (through the parallel arrangement described above, is now one-quarter of that of the series connection (or switch point *a* connection) and the frequency range covered is from 40 to 100. This frequency range is illustrated on scale 52 of Fig. 4.

In the above example, the scale ratio for the lowest frequency subscale was 2½ to 1. The frequency spectrum for the low frequency subscale was obtained from the series connection of the potentiometer resistance circuit. Since the frequency spectrum for the high frequency subscale was obtained by paralleling the aforesaid series connected potentiometer resistance circuits, the frequency values covered thereon will be four times those covered on the low frequency subscale. These scale ratios, for the above two subscales provide a scale of the decade type, as shown, in Fig. 4 wherein the lowest frequency subscale covers readings from 10 to 25 and the highest frequency subscale covers readings from 40 to 100.

Up to this point the structure of the tuning unit relating to the subscales covering readings from 10 to 25 and from 40 to 100 has been described. These two subscales (if a slide rule type dial is used, that type being illustrated in the drawings for the purpose of simplicity only), are read from left to right for ascending frequencies, as illustrated in subscales 50 and 52 of Fig. 4. To complete the decade type scale to present continuous spectrum from 10 to 100, an intermediate subscale is required to cover the readings from 25 to 40 inclusive. This intermediate subscale, in accordance with the presently preferred embodiment of the invention as illustrated in the drawings, will read from right to left for ascending frequencies in contradistinction to the first and third subscales which read from left to right for ascending frequencies. This positioning of the intermediate subscale, and the particular means associated therewith in the tuning unit, avoids the necessity of returning the dial pointer to the extreme left when moving from the first subscale to the intermediate subscale on the dial or from the intermediate subscale to the third subscale. For this intermediate subscale, the switching points *b*, *e* and *h* of the switch decks 24 through 27 are used. The switch points on these decks are interconnected as shown and are further connected to the potentiometer resistance circuits between the terminals 14*f* and 14*g* and 16*f* and 16*g*. Shunt resistors 14*j* and 16*j* are connected across the terminals 14*f* and 14*g* and 16*f* and 16*g*, respectively.

When the switch arms 24*k* through 27*k* are placed in contact with the switch points *b* or their equivalent switch points *e* and *h*, the potentiometer resistance circuits between the terminals 14*f* and 14*g* and 16*f* and 16*g* are included in the tuning circuit as single units. The connection of the potentiometer resistance circuits between the terminals 14*f*, 14*g* and 16*f*, 16*g* into the tuning unit will be termed a single reversed connection to distinguish said connection from the series and parallel connections described at an earlier point in this specification. The potentiometer resistance circuits between the terminals 14*f* and 14*g* and 16*f* and 16*g* have a decreasing resistance characteristic as the potentiometer arms 14*a* and 16*a* move clockwise towards terminals 14*n* and 16*n*, respectively, as the result of a counter-clockwise movement of the dial shaft 21. Therefore, subscale 51 of Fig. 4, which is indicative of the frequency range controlled by the potentiometer resistance circuits between terminals 14*f*, 14*g*, and 16*f*, 16*g* depicts ascending frequency readings from right to left in contradistinction to the ascending frequency readings set forth from left to right on subscales 50 and 52 of Fig. 4. This presentation of ascending frequencies on the intermediate subscale 51 of Fig. 4 from right to left in conjunction with subscales 50 and 52 of Fig. 4, provides a tuning unit for continuous frequency tuning through subscales 50 through 51 through 52. At the high frequency end of the third subscale, (i. e., subscale 52 of Fig. 4) the pointer must, of necessity, be returned to the low frequency end of the first subscale (i. e., subscale 50 of Fig. 4). If tuning is to be continued from there on, the next set of multiplier condensers must be introduced which takes place automatically when the selector switch is advanced.

Referring to Fig. 2 it may be seen that the tuning resistances included in the tuning circuit for the switch points 24*b* through 27*b*, or for the equivalent switch points 24*e* through 27*e* and 24*h* through 27*h* will again appear between the switch arms 24*k* and 25*k* and 26*k* and 27*k*. In addition, the tuning condensers 30 through 32, and 34 through 36 are placed in the proper relation to these tuning resistances by the positioning of the switch arms 28*k* and 29*k* when on the switch points *b*, *e* or *h* of the switch decks 28 and 29.

Since, for the sake of the continuity in tuning, the same frequency readings are required on the extreme right end of the scales 50 and 51 and similarly on the extreme left end of the scales 51 and 52 and since the tuning condenser capacities remain unchanged, the tuning resistance in the tuning circuit corresponding to the frequency present at the right hand end of subscale 50 must be equal to the tuning resistance in the tuning circuit at the beginning or right hand end of subscale 51. Likewise, the tuning resistance in the tuning circuit at the high frequency or extreme left end of subscale 51 must be the same as the tuning resistance in the tuning circuit at the low frequency or extreme left end of subscale 52.

The frequency spectrum covered by the intermediate subscale 51 is from 25 to 40. The ratio of the maximum to minimum frequency readings for this subscale is eight to five, which requires that the ratio of the minimum tuning resistance to maximum tuning resistance for the frequency spectrum of said subscale be five to eight. This ratio of tuning resistance requires that the variable portion of the tuning resistance be three parts of the eight parts of the maximum tuning resistance. In addition, in order to achieve the requisite coincidence of the frequency values at the extreme right hand ends of subscales 50 and 51 and the coincidence of the frequency values at the extreme left hand ends of subscales 51 and 52, the minimum tuning resistance required for the frequencies covered on subscale 50 must be equal to the maximum tuning resistance required for the frequencies covered on subscale 51; and the minimum tuning resistance required for the frequencies covered on subscale 51 must be equal to the maximum tuning resistance required for the frequencies covered on subscale 52.

In the examples set forth above with respect to frequency coverage of subscales 50 and 52, it was stated that the minimum tuning resistance required for the frequencies covered on subscale 50 was 24,000 ohms and that the maximum tuning resistance required for the frequencies covered on subscale 52 was 15,000 ohms.

For tuning, the potentiometers 14 and 16 with a variable portion of 18,000 ohms each are available. If these 18,000 ohms were to represent three parts out of the eight parts that form the total or maximum resistance required in the circuit, this total resistance would amount to 48,000 ohms, i. e., 18,000 ohms variable and 30,000 ohms fixed.

It is evident that the variable portion as well as the fixed portion of a tuning circuit that comprises 18,000 ohms variable resistance for tuning must be modified to obtain the required values of 24,000 ohms for minimum frequency tuning and 15,000 ohms for maximum frequency tuning on scale 51. These two conditions are a prerequisite for continuous tuning with the same condensers. This is attained by paralleling both the fixed series resistors in the circuit maximum tuning and the sum of these fixed series resistors and the variable portion of 18,000 ohms obtained from the potentiometers 14 and 16 for minimum frequency tuning with shunt resistors. These are the resistors 14*j* and 16*j* in the circuit of Fig. 2.

Satisfaction of the above two conditions is obtained by the series parallel networks making up the potentiometer resistance circuits between the terminals 14*f*, 14*g* and 16*f*, 16*g*. These series parallel networks include the variable resistors 14*i* and 16*i*, the fixed resistors 14*h* and 16*h*, the portions of the potentiometers between the terminals 14*n* and 16*n* and the movable arms 14*a* and 16*a* and the shunt resistors 14*j* and 16*j*.

Again assuming the resistance of the portions of the potentiometers 14 and 16 adjacent the terminals 14*n* and 16*n*, (i. e., those portions beyond the swing of the arms 14*a* and 16*a*) to be 1,000 ohms and considering this as part of the fixed resistance in the circuit, it is necessary that resistors 14*i* plus 14*h*, and 16*i* plus 16*h*, respectively, each must have a value of approximately 18,300 ohms. The shunt resistors 14*j* and 16*j* each must be equal to approximately 67,300 ohms in order to provide the required effective tuning resistance values across the terminals 14*f* and 14*g*, and 16*f* and 16*g*, respectively.

The above set of switch points, i. e., switch points *a*, *b*, and *c* on switch decks 24 through 27 present a complete tuning cycle in three steps and covers a range of frequencies of 10 to 100 cycles. The coverage of this frequency range on the three separate subscales presents a decade type scale from which accurate readings may be readily taken. The above three-step tuning cycle, as described hereinabove utilizes condensers 30 and 34 as the tuning condensers in the circuits. In order to provide a coverage for a range of frequencies ten times greater than the range of frequencies above described (through switch points *a*, *b*, and *c*), the condensers 30 and 34 must be replaced by condensers having one-tenth of their capacitive value. To accomplish this result, the condensers 31 and 35, which are one-tenth of the capacitive value of condensers 30 and 34, are connected to the tuning system when the movable arms 28*k* and 29*k* are in the *d*, *e* and *f* positions. The removal of condensers 30 and 34 and the insertion of condensers 31 and 35 is automatically performed by the connections of the switch decks 28 and 29. The frequency spectrum for the range of frequencies ten times greater than the range of frequencies obtained from the *a*, *b*, and *c* switch points is obtained in a manner similar to that described above except that switch points *d*, *e*, and *f* are utilized instead of switch points *a*, *b* and *c*.

Utilization of the switch points *d*, *e* and *f* in conjunction with appropriate manual utilization of the tuning control 22, thus provides a continuous coverage of a frequency spectrum from 100 to 1000 cycles on the three subscales 50, 51 and 52.

To cover a range of frequencies 100 times greater than the range covered on the first three positions of the six-deck selector switch, (i. e., for example, from 1000 to 10,000 cycles per second) the condensers 31 and 35 must be removed from the tuning circuit and the condensers 32 and 36 introduced in their place. Condensers 32 and 36 have a capacitive value equal to 1/100 of that of the condensers 30 and 34. Condensers 32 and 36 are included in the tuning circuit when the movable arms 28*k* and 29*k* are in the *g*, *h* and *i* positions. The frequency coverage of this third range of frequencies is presented on the three subscales in a manner similar to that described above with respect to switch points *a*, *b* and *c* except that switch points *g*, *h* and *i* are utilized in their place. Upon the completion of the three switching cycles, i. e., *a*, *b*, *c*; *d*, *e*, *f*; and *g*, *h*, *i*, a frequency spectrum of from 10 to 10,000 cycles per second has been presented. The next frequency band required is from 10,000 to 25,000 cycles per second. This will be read on scale 50, with the use of a multiplier of 1000 for direct reading.

To cover this frequency spectrum of from 10,000 to 25,000 cycles per second, the switch points *j* on switch decks 24 to 27 are connected to the switch points *i*. The operation of the circuits when the movable arms 24*k* through 27*k* are in contact with the points 24*i* to 27*i* is equivalent to that explained above when the movable arms 24*k* through 27*k* are in contact with the points 24*c* through 27*c*. Hence the switch arms 24*k* through 27*k* for the frequency band from 10,000 to 25,000 cycles per second are connected to the points 24*j* to 27*j* which is equivalent to a connection between switch points 24*i* to 27*i*. This parallel connection makes the tuning resistance included in the tuning ciruits four times smaller than that which was determined for the original series connection utilizing switch point *a*. Consequently, to utilize the scale 50 of Fig. 4 for an accurate presentation of this frequency range of from 10,000 to 25,000 cycles per second, the tuning condensers 33 and 37 will not be one-tenth of condensers 32 and 36 but will be four tenths of said capacity of condensers 32 and 36. Condensers 33 and 37 are introduced into the circuit when the movable arms 28*k* through 29*k* are in contact with the points 28*j* and 29*j*. Making these condensers, i. e., condensers 33 and 37, as high in value as possible in that manner is advantageous, since a high ratio of tuning capacity to circuit wiring capacity and to stray capacity to ground is obtained.

In the presently preferred embodiment of the invention, a six-deck selector switch has been shown. However, this switch could be replaced with a switch of the drum or commutator or any other type especially manufactured for this purpose. The use of this type of switch will avoid a good deal of the external type of wiring as shown in the Fig. 2.

If desired, the switch decks 24 through 27 may be separated physically and in their sequence of operation from the switch decks 28 and 29. The function of the switch decks 24 through 27 is to incorporate the tuning resistances into the tuning circuit in series, or as a single reversed unit, or in parallel. In so connecting the tuning resistances the switch decks 24 through 27 also preselect the particular subscales for presentation of the frequency spectrum and, therefore, taken as a combination, could be identified as a "scale selector switch."

The function of the switch decks 28 and 29 is to place the condensers 30 through 34, and 34 through 37 into the tuning circuit. Each pair of these condensers, determine the multiplier to be applied to the readings of the decade scale. The switch decks 28 and 29 taken as a unit, can therefore be identified as a "multiplier selector switch."

As explained at an earlier point in this specification, the switch points *a*, *d* and *g* on the switch decks 24 and 27 provide equivalent tuning resistance arrangements. The grouping of these switch points could be replaced by a single switch point. In a similar manner, the switch points *b*, *e* and *h* also perform equivalent functions as do the switch points *c*, *f* and *i*. Consequently, each of these groups of switch points, i. e., *a*, *d* and *g*; *b*, *e* and *h*; and *c*, *f* and *i* could each be replaced by a single switch point.

An examination of switch decks 28 and 29 in Fig. 2 shows that the switch points *a*, *b* and *c* are tied together, as are switch points *d*, *e*, and *f*; and *g*, *h* and *i*, as combinations performing the same function, i. e., selecting a pair of tuning condensers from the pairs 30 through 33 and 34 through 37 and placing them in their proper relationship to the tuning circuit. As described above, each pair of condensers provides, in effect, the multiplier to be applied to the decade scale. Therefore, if desired, the switch points *a*, *b*, *c*; *d*, *e*, *f*; and *g*, *h* and *i* of the switch decks 28 and 29 can be combined and represented by single switch points and also, if desired, may be expanded to include new pairs of condensers in order to include multipliers of greater value than described above.

Referring now to Fig. 4, it is noted that the higher frequency readings on the right hand end of the subscale 52 are relatively crowded together, as compared with the readings on the subscales 50 and 51. However, as a part of this invention, a method and structure has been devised for expanding and/or contracting the coverage of the subscales or, in other words, for spreading out or contracting the frequency distribution over the subscales to correct scale crowding. This becomes of particular value if potentiometers of straight-line resistance characteristic are being used, as in the present examples, although it will be clear that subscale expansion and/ or contraction must be also useful when quasi-linear scales are wanted.

An alternative construction of a portion of the tuning unit, incorporating the means for spreading or contracting, or in short, equalizing the frequency divisions of the decade scale, is illustrated in Fig. 3. As the means for equalizing the frequency divisions relates only to the potentiometers and their associated switching members and does not relate in any way to the tuning condensers included in the multiplier section of the tuning unit, Fig. 3 illustrates solely a portion of the tuning unit relating to one pair of tuning potentiometers and its associated switching members, it being understood that the other pair of potentiometers will have a similar construction and that the resistance elements in their entirety will be incorporated into the completed tuning unit as heretofore illustrated in Fig. 2.

There is provided a pair of tuning potentiometers 40 and 41. These potentiometers are similar in construction to either one of the pairs of potentiometers illustrated in Fig. 2, i. e., for example, potentiometers 16 and 17 or potentiometers 14 and 15. The counter-clockwise terminals 40*m* and 41*m* of the potentiometers 40 and 41, respectively, are directly connected to terminals 40*e* and 41*e*, respectively, on a terminal strip 42. The extreme clockwise terminal 40*n* of potentiometer 40 is connected to terminal 40*g* on the terminal strip 42 through a fixed resistor 40*h* and a variable resistor 40*i*. The movable arm 40*a* of the potentiometer 40 is directly connected to a terminal 40*f* on said terminal strip 42. Connected across the terminals 40*f* and 40*g* on said terminal strip 42 is a shunt resistor 40*j*. The resistors 40*h* through 40*j* and 41*h* through 41*j* correspond in their purpose and function to 14*h* through 14*j* and 16*h* through 16*j* of Fig. 2. The clockwise terminal 41*n* of the potentiometer 41 is directly connected to terminal 41*g* and the movable arm 41*a* is directly connected to terminal 41*f* on said terminal strip 42.

Connected between the terminal 40*e* and a common terminal 42*a* on said terminal strip 42 is a fixed resistor 40*b*. Connected between the terminal 41*e* and the common terminal 42*a* is a fixed resistor 41*b*. The resistors 40*b* and 41*b* each replace the variable adjusting resistor and its series fixed resistor connected between one side of the potentiometers and the terminal strip in the circuit illustrated in Fig. 2, i. e., such as resistors 16*b*, 16*c*; and 17*b*, 17*c* in Fig. 2.

Replacing the above described series connected fixed and variable resistors of Fig. 2 by the fixed resistors 40*b* and 41*b* does away with the refinement of the possibility of alignment and readjustment of the scales at any time. However, the value of 40*b* and 41*b* may be permanently established by test before the unit is finally assembled. The same also would apply to 40*i* plus 40*h*, and 41*i* plus 41*h*. The refinement of adjustability of variable resistors 40*h* and 41*h* has been retained to provide a means available to align the extremes of the midscale (to which these resistors apply) with the beginnings and ends of the top and lower scales.

At an earlier point in the specification, the feasibility of replacing the groups of switch points that provided equivalent circuit arrangements by a single switch point was examined and discussed. This simplification has been incorporated into the circuit illustrated in Fig. 3. The switch arrangement illustrated in Fig. 2 has been simplified and in place of the arrangement therein described, three-point switch decks are utilized in the circuit disclosed in Fig. 3. In effect, the switch points *a*, *d*, and *g* of switch decks 24 and 25 of Fig. 2 have been replaced by a single switch point identified as switch point *x* on switch decks 43 and 44. Switch points *b*, *e* and *h* of switch decks 24 and 25 of Fig. 2 have been replaced by a single switch point *y* in the switch decks 43 and 44. In a similar manner, switch points *c*, *f*, and *i* of switch decks 24 and 25 of Fig. 2 have been replaced by switch points *z* in switch decks 43 and 44.

The circuit of Fig. 3 also incorporates an additional three-point switch deck 45, whose switch points are identified as *x*, *y* and *z* in accordance with the identification of the switch points on decks 43 and 44.

Also incorporated into the tuning circuit illustrated in Fig. 3 are fixed resistors 46 and 47, resistor 46 being connected between switch point 43z and terminal 42a, and resistor 47 being connected between switch point 44z and terminal 42a. It is to be noted that the only connection between the potentiometers 40 and 41, of the three possible arrangements described above with respect to Fig. 2, i. e., series, single reversed, and parallel, effected by the newly introduced parts is the parallel connection of the potentiometer resistance circuits between terminals 42a and 40f, and 42a and 41f when the switch arms 43k and 44k are in the z position. The addition of the third three-point switch deck, i. e., switch deck 45 is required because in the x position of switch decks 43 and 44, the lead 48 connecting switch points 44x and 45z would, without the insertion of the switch deck 45, place the newly introduced resistor 46 in parallel with the potentiometer resistance circuit between the terminals 42a and 41f. This would diminish the amount of resistance available for tuning the lowest frequency subscale in the series connection of the two potentiometer resistance circuits between the terminals 42a and 40f, 42a and 41f. However, if the resistor 46 should be of sufficiently high value in relation to the resistance values of the potentiometer resistance circuit between the terminals 42a and 41f paralleled with it, useful tuning scales may still be obtained. The circuit illustrated in Fig. 3 is an alternative construction for a portion of the resistance tuning in the tuning unit as described in its entirety in Fig. 2.

An examination of Fig. 4 reveals that the frequency values at the high frequency end of subscale 52 are relatively crowded together as compared with the remaining frequency values on subscale 52 and the remainder of the subscales. This relative crowding of frequency values at the high frequency end of subscale 52 renders direct accurate reading in said area a more difficult operation than at other locations on the subscales. The circuit described in Fig. 3 is such that the frequency coverage of each one of the three subscales of the decade scale may be varied at will to suit predetermined requirements.

If it is desired to relieve the crowding at the high frequency end of the highest frequency subscale, i. e., for example such as subscale 52 in Fig. 4, a suitable choice of resistance values in the potentiometer tuning circuits may be formulated.

This method of relieving the crowding at the high frequency end of the high frequency subscale will be explained by the following example, it being kept in mind that the ratio of maximum tuning resistance to the minimum tuning resistance for any particular frequency spectrum is to be equal to the ratio of the highest frequency value to the lowest frequency value bounding said particular frequency spectrum. In addition, in order to provide for continuous tuning, as described above in detail for scale 51 in relation to Fig. 2, the conditions there set forth must be observed.

Figure 5:
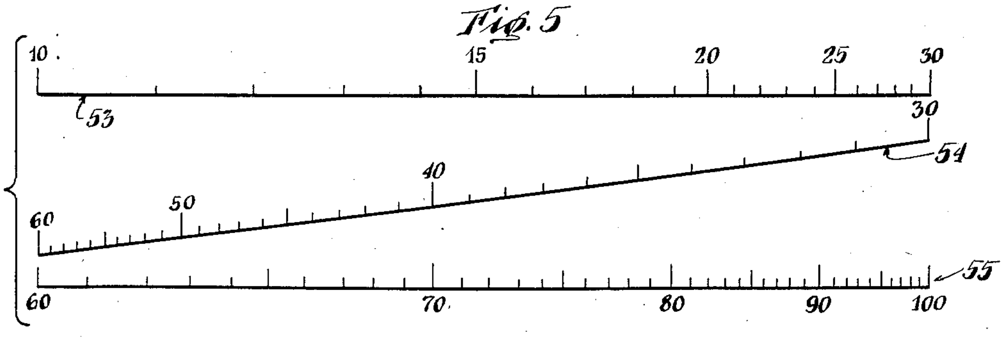
Fig. 5 is a representation of an enlarged decade type tuning scale for use with a tuning circuit embodying the scale equalizing means set forth in Fig. 3.

Referring to Fig. 5, it is assumed by way of example that a subscale 53 having a greater number of scale divisions thereon than subscale 50 of Fig. 4 is desired. The frequency spectrum of subscale 53 of Fig. 5 may then be preselected to cover a frequency range of from 10 to 30 cycles. The scale ratio for this subscale is therefore 1 to 3, which, in accordance with the examples set forth above in relation with Fig. 2 requires the minimum tuning resistance to be one third of the maximum tuning resistance for the subscale, or, what is the same, to be one half the value of the variable portion of the potentiometers 40 and 41. If the variable portion of the potentiometers are again assumed to be 18,000 ohms, and the unused portions adjacent to the terminals 40m and 41m; and 40n and 41n to be 1,000 ohms, the fixed resistance for the potentiometer resistance circuits between the terminals 42a and 40f; and 42a and 41f would have to be one half of the usable variable resistance portion of said potentiometer, i. e., one half of 18,000 ohms or 9,0000 ohms. Consequently, 40b and 41b must be 9,000 ohms less 1,000 ohms or 8,000 ohms each. Thus when the potentiometer resistance circuit between the terminals 42a and 40f is connected in series with the potentiometer resistance circuit between the terminals 42a and 41f, the maximum resistance will be 54,000 ohms, i. e., twice the variable portion of 18,000 ohms plus twice the fixed portion of 9,000 ohms.

If a spreading of the frequency values on the high frequency end of the high frequency subscale, i. e., such as subscale 52 of Fig. 4, is desired, the coverage of the high frequency subscale may be preselected to be, for example, from 60 to 100, as shown on subscale 55 of Fig. 5. Stated in other words, the lowest frequency reading on subscale 55 is then six times the lowest frequency reading of 10 on subscale 53. As the frequencies involved are inversely proportional to the resistances that are utilized to tune said frequencies, it follows that the maximum tuning resistance for subscale 55 will have to be one sixth of the maximum tuning resistance available for tuning subscale 53. As the maximum tuning resistance available for tuning subscale 53 was 54,000 ohms, the maximum tuning resistance required for tuning subscale 55 must be one sixth of that value or 9,000 ohms.

The maximum tuning resistance of 9,000 ohms for subscale 55 is obtained by connecting the potentiometer resistance circuit between terminals 42a and 40f in parallel with the potentiometer resistance circuit between the terminals 42a and 41f. An examination of these values reveals that the maximum resistance obtainable in the paralleling of these potentiometer resistance circuits is 13,500 ohms. Consequently, further paralleling will be necessary in order to arrive at the required value of 9,000 ohms as the maximum tuning resistance for this circuit. This added resistor to be connected in parallel with the parallel circuit of the above mentioned potentiometer resistance circuits is resistor 46.

In addition to the above requirements for maximum tuning resistance, it must be kept in mind that at the maximum frequency readings the ratio of the two highest frequencies on scale 53 and scale 55 will be 30 to 100. The resistances available for tuning these two frequencies therefore must have a relationship of 100 to 30 when the same tuning condenser is used for both the frequencies.

The minimum tuning resistance for subscale 55 must therefore be three tenths of the minimum tuning resistance that was used for subscale 53. The minimum tuning resistance available for subscale 53 was the series connection of the two fixed resistances, each of 9,000 ohms or a total of 18,000 ohms. Therefore, the minimum tuning resistance available for subscale 55 will be three tenths of this value or 5,400 ohms. This 5,400 ohms will be obtained in part from the parallel connection of the potentiometer resistance circuits between 42a and 40f and 42a and 41f, respectively. The minimum tuning resistance available from paralleling the above mentioned potentiometer resistance circuits is 4,500 ohms and consequently, the inclusion of an additional series resistor is required to bring the resultant value of 4,500 ohms up to the required value of 5,400 ohms. This required series resistor is the resistor 47 in Fig. 3. The actual values of resistors 46 and 47 of Fig. 3 must satisfy the following conditions. First, the previously discussed 13,500 ohms paralleled by the value of resistor 46 and supplemented by the resistor 47 must result in the circuit providing 9,000 ohms for minimum frequency tuning on subscale 55 of Fig. 5. Next, the 4,500 ohms previously discussed paralleled by the value of resistor 46 and supplemented by the value of resistor 47 must total 5,400 ohms in order to obtain the maximum frequency reading on scale 55 of Fig. 5.

In the circuit illustrated in Fig. 3 satisfaction of the above two conditions reveals that resistor 46 must be approximately 14,850 ohms and resistor 47 must be approximately 1,950 ohms.

An examination of the coverage of the subscales 53 and 55 reveals that the remaining subscale 54 must cover a frequency spectrum of from 30 to 60. The tuning resistance required for obtaining the lowest or extreme right hand frequency reading, i. e., 30, which corresponds to the highest frequency reading on subscale 53, must be 18,000 ohms. Similarly, the highest reading on subscale 54, i. e., 60, which corresponds to the lowest reading on subscale 55 requires a tuning resistance of 9,000 ohms. Applying these values to the potentiometer resistance circuit included between the terminals 40f and 40g, it is found that, in the manner as was explained for Fig. 2, and assuming 1,000 ohms to remain in the unused portion of the potentiometer circuit adjacent to terminal 40n, the resistors 40h and 40i must total approximately 10,150 ohms and that resistor 40j must be approximately 46,700 ohms. The above actual values incorporated in the circuit set forth in Fig. 3 provide a scale proportioned as that illustrated in Fig. 5.

The method of scale equalization for exercising control over the frequency distribution on a set of subscales, as explained above in connection with the circuit of Fig. 3, provides a tuning system of great flexibility. Utilization of the method therein described permits the utilization of any desired frequency distribution over the subscales of the tuning unit. The method therein described may be used for a decade scale of the type illustrated in the drawings or for any other scale.

The basic circuit described in Fig. 3 remains the same irrespective of the frequency distribution desired on the subscales of the tuning unit. However, the values of the circuit elements included therein will vary in accordance with the frequency distribution required.

The following examples are included without explanation to clearly illustrate the flexibility and versatility of the above described structure and method. In all of the following examples, it will be assumed in accordance with the other examples previously set forth, that each of the potentiometers provides 18,000 ohms of variable resistance and that the portions of each of the potentiometers adjacent the terminals thereof will be 1000 ohms, which resistance portions will be included in the circuit as a fixed resistance. This assumption is in accord with the examples discussed above with respect to Figs. 2 and 3.

If a tuning scale is desired wherein the lowest frequency subscale tunes from 10 to 25, the intermediate subscale tunes from 25 to 60, and the highest frequency subscale tunes from 60 to 100 resistors 40b and 41b must each be approximately 11,000 ohms, resistors 40h and 40i must total approximately 9750 ohms, resistor 40j must be approximately 143,000 ohms, resistor 46 must be approximately 20,360 ohms and resistor 47 must be approximately 1350 ohms.

The above values are values calculated from a circuit arrangement such as that described in Fig. 3.

If it is desired to have the low frequency subscale tune from 10 to 50, the intermediate subscale tune from 50 to 80 and the high frequency subscale tune from 80 to 100, the following values for circuit elements must be included in the circuit illustrated in Fig. 3. Resistors 40b and 41b must be approximately 3500 ohms each, resistors 40h and 40i must total approximately 8750 ohms, resistor 40j must be approximately 13,300 ohms, resistor 46 must be approximately 3100 ohms, and resistor 47 must be approximately 3200 ohms. As in the example given above, these values are values calculated from a circuit such as that described in Fig. 3.

If desired, the equalized subscales illustrated in Figs. 4 and 5 may be made quasi-linear by using specially tapered tuning potentiometers in the circuits illustrated in Fig. 2 and Fig. 3.

The versatility and flexibility of the tuning system and particularly the embodiment illustrated in Fig. 3 is clearly evidenced by the fact that any predetermined scale representing the frequency coverage for an assembled tuning unit may be made to the customer's order by inserting resistors 40b, 41b, 40h, 40i, 40j, 46 and 47, and their equivalents in the twin tuning circuits, one of which being shown in Fig. 3, of the proper predetermined values in accordance with the above described method. This flexibility will be aided by strategically locating and designing the terminal strip 42 so that the above listed resistors will be easily accessible and easily installed upon order.

In the foregoing portions of this specification describing in detail the presently preferred embodiment of the invention, it was shown that the tuning frequency was inversely proportional to the amount of tuning resistance in the circuit. The tuning of the preferred embodiment was effected by providing a continuous variation of the tuning resistance from a predetermined maximum value through a predetermined minimum value. This continuous variation of the tuning resistance was accomplished in three separate steps, i. e., the above described series connection, single reversed connection and parallel connection of the potentiometer resistance circuits.

Since the tuning of the preferred band spread tuning circuit was effected by varying the tuning resistance and presenting the frequency values on a plurality of subscales, an alternative embodiment of the invention could utilize these subscales to represent the amount of resistance present at any instance in the tuning circuit. In other words, the plurality of subscales could be calibrated in resistance values rather than frequency values.

If it is desired to provide subscales calibrated in resistance values rather than frequency values in order to provide a band spread rheostat, each pair of tuning potentiometers, with their associated fixed resistances and switching arrangements as illustrated in Fig. 3, apart from the remaining portions of the preferred tuning circuit, could be used, without any change, as a continuous variable band spread resistor or band spread rheostat. The resistance values of this band spread resistor or band spread rheostat would then be spread over the plurality of subscales, and taken together would represent a scale length that would be approximately three times longer than one that could be obtained from a pointer mounted directly on a variable rheostat shaft. The subscales for this variable band spread rheostat could be of the decade type as illustrated in Figs. 4 and 5, or could be varied over greater resistance spreads by the method described in conjunction with the circuit illustrated in Fig. 3. The effective resistance for any given switch and potentiometer arm setting would appear between the potentiometer arms *44k* and *45k* of Fig. 3.

Although the above specification illustrates a tuning unit including a pair of variable resistance members and a pair of fixed condensers, i. e., of the type basically illustrated in Fig. 1, it is clear to one skilled in the art that tuning units utilizing a single resistor and a single condenser will function effectively for some applications. If it is desired to utilize only one tuning resistor and one tuning condenser, an equivalent spread of values may be obtained by utilizing a resistance circuit of the type illustrated in Fig. 3, or of the type shown dually in Fig. 2, either alone or in conjunction with a bank of condensers such as that illustrated in Fig. 2 without departing from the spirit of this invention.

While I have illustrated my invention merely by showing a preferred embodiment thereof as would be used with an audio oscillator, it is clear that many variations thereof, and varying uses thereof may be made by those skilled in the art within the teachings of this disclosure.

In accordance with the provisions of the patent statutes, I have herein described the principle of operation of this invention, together with the elements which I now consider the best embodiments thereof, but I desire to have it understood that the structure disclosed is only illustrative and the invention can be carried out by other means. Also, while it is designed to use the various features and elements in the combinations and relations described, some of these may be altered and modified without interfering with the more general results outlined.

Having thus described my invention, I claim:

1. A bandspread tuning circuit, comprising, first and second variable resistance tuning members connected in series with an intermediate first fixed capacitive member, a second fixed capacitive member shunted across said second variable resistance tuning member, said first and second fixed capacitive members each comprising a plurality of fixed capacitors having predetermined values, said capacitors being selectively adapted for individual connection into said tuning circuit, switching means for effecting the selected connection of said capacitors, said first and second variable resistance tuning members each comprising a pair of tuning resistance circuits, said tuning resistance circuits each including at least a potentiometer and a fixed resistance, each of said tuning resistance circuits being selectively adapted for single reversed connection of one alone, for connection of each of said pairs in series, and for connection of each of said pairs in parallel, said fixed resistances and said potentiometers having predetermined values so that the minimum tuning resistance for the aforesaid series connection is equal to the maximum tuning resistance for the aforesaid single reversed connection, and so that the minimum tuning resistance for the aforesaid single reversed connection is equal to the maximum tuning resistance for the aforesaid parallel connection, and second switching means for effecting any selected one of the aforesaid connections to constitute said first and second variable resistance tuning members from said pairs of tuning resistance circuits.

2. A bandspread tuning circuit, comprising, first and second variable resistance tuning members connected in series with an intermediate first fixed capacitive member, a second fixed capacitive member shunted across said second variable resistance tuning member, said first and second fixed capacitive members each comprising a plurality of fixed capacitors having predetermined values, said capacitors being selectively adapted for individual connection into said tuning circuit, switching means for effecting the selected connection of said capacitors, said first and second variable resistance tuning members each comprising a pair of tuning resistance circuits, said tuning resistance circuits each including at least a potentiometer and a fixed resistance, each of said tuning resistance circuits being selectively adapted for single reversed connection of one alone, for connection of each of said pairs in series, and for connection of each of said pairs in parallel, said resistances and said potentiometers having predetermined values so that the minimum tuning resistance for the aforesaid series connection is substantially equal to the maximum tuning resistance for the aforesaid single reversed connection, and so that the minimum tuning resistance for the aforesaid single reversed connection is substantially equal to the maximum tuning resistance for the aforesaid parallel connection, and second switching means for effecting any selected one of the aforesaid connections to constitute said first and second variable resistance tuning members from said pairs of tuning resistance circuits.

3. A bandspread tuning circuit, comprising, first and second variable resistance tuning members connected in series with an intermediate first fixed capacitive member, a second fixed capacitive member shunted across said second variable resistance tuning member, said first and second fixed capacitive members each comprising a plurality of fixed capacitors having predetermined values, said capacitors being selectively adapted for individual connection into said tuning circuit, switching means for effecting the selected connection of said capacitors, said first and second variable resistance tuning members each comprising a pair of tuning resistance circuits, said tuning resistance circuits each including at least a potentiometer and a fixed resistance, each of said tuning resistance circuits being selectively adapted for single reversed connection of one alone, for connection of each of said pairs in series, and for connection of each of said pairs in parallel, said resistances and said potentiometers having predetermined values so that the minimum tuning resistance for the aforesaid series connection is substantially equal to the maximum tuning resistance for the aforesaid single reversed connection, and so that the minimum tuning resistance for the aforesaid single reversed connection is substantially equal to the maximum tuning resistance for the aforesaid parallel connection, and so that the maximum tuning resistance for the aforesaid series connection and the minimum tuning resistance for the aforesaid parallel connection together with said first and second capacitive members predetermine the scope of frequency coverage of the bandspread tuning circuit, and second switching means for effecting any one of the aforesaid connections to constitute said first and second variable resistance tuning members from said pairs of tuning resistance circuits.

4. A bandspread tuning circuit, comprising, first and second variable resistance tuning members connected in series with an intermediate first fixed capacitive member, a second fixed capacitive member shunted across said second variable resistance tuning member, said first and second fixed capacitive members each comprising a plurality of fixed capacitors having predetermined values, said capacitors being selectively adapted for individual connection into said tuning circuit, switching means for effecting the selected connection of said capacitors, said first and second variable resistance tuning members each comprising a pair of tuning resistance circuits, said tuning resistance circuits each including at least a potentiometer and a fixed resistance, each of said tuning resistance circuits being selectively adapted for single reversed connection of one alone, for connection of each of said pairs in series, and for connection of each of said pairs in parallel, said resistances and said potentiometers having predetermined values so that the minimum tuning resistance for the aforesaid series connection is substantially equal to the maximum tuning resistance for the aforesaid single reversed connection, so that the minimum tuning resistance for the aforesaid single reversed connection is substantially equal to the maximum tuning resistance for the aforesaid parallel connection, and so that the resistance of each of said tuning resistance circuits may be varied through a predetermined resistance ratio, and second switching means for effecting any selected one of the aforesaid connections to constitute said first and second variable resistance tuning members from said pairs of tuning resistance circuits.

5. A bandspread tuning unit, comprising, a continuous frequency indicating scale presenting the frequency coverage of the tuning unit on three subscales, first and second variable resistance tuning members connected in series with an intermediate first fixed capacitive member, a second fixed capacitive member shunted across said second variable resistance tuning member, said first and second fixed capacitive members each comprising a plurality of fixed capacitors having predetermined values, said capacitors being selectively adapted for individual connection into said tuning circuit, switching means for effecting the selected connection of said capacitors, said first and second variable resistance tuning members each comprising a pair of tuning resistance circuits, said tuning resistance circuits each including at least a potentiometer and a fixed resistance, each of said tuning resistance circuits being selectively adapted for single reversed connection of one alone, for connection of each of said pairs in series, and for connection of each of said pairs in parallel, said resistances and said potentiometers having predetermined values, so that the minimum tuning resistance for the aforesaid series connection is substantially equal to the maximum tuning resistance for the aforesaid single reversed connection, so that the minimum tuning resistance for the aforesaid single reversed connection is substantially equal to the maximum tuning resistance for the aforesaid parallel connection, and so that the ratios of the maximum to minimum tuning resistances for each of the aforesaid series, single reversed, and parallel connections are substantially equal to the ratios of the maximum to minimum frequencies presented on each of said three subscales respectively, second switching means for effecting any selected one of the aforesaid connections to constitute said first and second variable resistance tuning members from said pairs of tuning resistance circuits, and means coacting with said potentiometers and said frequency indicating scale for visually indicating the frequency setting of said tuning unit.

6. A bandspread tuning circuit, comprising, first and second variable resistance tuning members connected in series with an intermediate first fixed capacitive member, a second fixed capacitive member shunted across said second variable resistance tuning member, said first and second fixed capacitive members each comprising a plurality of fixed capacitors having predetermined values, said capacitors being selectively adapted for individual connection into said tuning circuit, switching means for effecting the selected connection of said capacitors, said first and second variable resistance tuning members each comprising a pair of tuning resistance circuits, said tuning resistance circuits each including at least a potentiometer and a fixed resistance, each of said resistance tuning circuits being selectively adapted for single reversed connection of one alone paralleled by a shunt resistance, for connection of each of said pairs in series, and for connection of each of said pairs in parallel, said fixed resistances, said shunt resistances, and said potentiometers having predetermined values so that the minimum tuning resistance for the aforesaid series connection is substantially equal to the maximum tuning resistance for the aforesaid single reversed connection, and so that the minimum tuning resistance for the aforesaid single reversed connection is substantially equal to the maximum tuning resistance for the aforesaid parallel connection, and second switching means for effecting any selected one of the aforesaid connections to constitute said first and second variable resistance tuning members from said pairs of tuning resistance circuits.

7. A bandspread tuning unit, comprising, a continuous frequency indicating scale presenting the frequency coverage of the tuning unit on three subscales, first and second variable resistance tuning members connected in series with an intermediate first fixed capacitive member, a second fixed capacitive member shunted across said second variable resistance tuning member, said first and second fixed capacitive members each comprising a plurality of fixed capacitors having predetermined values, said capacitors being selectively adapted for individual connection into said tuning circuit, switching means for effecting the selected connection of said capacitors, said first and second variable resistance tuning members each comprising a pair of tuning resistance circuits, said tuning resistance circuits each including at least a potentiometer and a fixed resistance, each of said resistance tuning circuits being selectively adapted for single reversed connection of one alone paralleled by a shunt resistance, for connection of each of said pairs in series, and for connection of each of said pairs in parallel, said fixed resistance, said shunt resistances and said potentiometers having predetermined values so that the minimum tuning resistance for the aforesaid series connection is substantially equal to the maximum tuning resistance for the aforesaid single reversed connection, so that the minimum tuning resistance for the aforesaid single reversed connection is substantially equal to the maximum tuning resistance for the aforesaid parallel connection, and so that the ratios of the maximum to minimum tuning resistances for each of the aforesaid series, single reversed, and parallel connections are substantially equal to the ratios of the maximum to minimum frequencies presented on each of said three subscales respectively, second switching means for effecting any selected one of the aforesaid connections to constitute said first and second variable resistance tuning members from said pairs of tuning resistance circuits, and means coacting with said potentiometers and said frequency indicating scale for visually indicating the frequency setting of said tuning unit.

8. A bandspread tuning circuit, comprising, first and second variable resistance tuning members connected in series with an intermediate first fixed capacitive member, a second fixed capacitive member shunted across said second variable resistance tuning member, said first and second fixed capacitive members each comprising a plurality of fixed capacitors having predetermined values, said capacitors being selectively adapted for individual connection into said tuning circuit, switching means for effecting the selected connection of said capacitors, said first and second variable resistance tuning members each comprising a pair of tuning resistance circuits, said tuning resistance circuits each including at least a potentiometer and a fixed resistance, each of said tuning resistance circuits being selectively adapted for single reversed connection of one alone paralleled by a shunt resistance, for connection of each of said pairs in series, and for connection of each of said pairs in parallel with an auxiliary shunt and series resistance, said fixed resistances, said shunt resistances, said auxiliary shunt and series resistances, and said potentiometers having predetermined values so that the minimum tuning resistance for the aforesaid series connection is substantially equal to the maximum tuning resistance for the aforesaid single reversed connection, and so that the minimum tuning resistance for the aforesaid single reversed connection is substantially equal to the maximum tuning resistance for the aforesaid parallel connection, and second switching means for effecting any selected one of the aforesaid connections to constitute said first and second variable resistance tuning members from said pairs of tuning resistance circuits.

9. A bandspread tuning unit, comprising, a continuous frequency indicating scale presenting the frequency coverage of the tuning unit on three subscales, first and second variable resistance tuning members connected in series with an intermediate first fixed capacitive member, a second fixed capacitive member shunted across said second variable resistance tuning member, said first and second fixed capacitive members each comprising a plurality of fixed capacitors having predetermined values, said capacitors being selectively adapted for individual connection into said tuning circuit, switching means for effecting the selected connection of said capacitors, said first and second variable resistance tuning members each comprising a pair of tuning resistance circuits, said tuning resistance circuits each including at least a potentiometer and a fixed resistance, each of said tuning resistance circuits being selectively adapted for single reversed connection of one alone paralleled by a shunt resistance, for connection of each of said pairs in series, and for connection of each of said pairs in parallel with an auxiliary shunt and series resistance, said fixed resistances, said shunt resistances, said auxiliary shunt and series resistances, and said potentiometers having predetermined values, so that the minimum tuning resistance for the aforesaid series connection is substantially equal to the maximum tuning resistance for the aforesaid single reversed connection, so that the minimum tuning resistance for the aforesaid single reversed connection is substantially equal to the maximum tuning resistance for the aforesaid parallel connection, and so that the ratios of the maximum to minimum tuning resistances for each of the aforesaid series, single reversed, and parallel connections are substantially equal to the ratios of the maximum to minimum frequencies presented on each of said three subscales respectively, second switching means for effecting any selected one of the aforesaid connections to constitute said first and second variable resistance tuning members from said pairs of tuning resistance circuits, and means coacting with said potentiometers and said frequency indicating scale for visually indicating the frequency setting of said tuning unit.

10. A bandspread tuning circuit, comprising, first and second variable resistance tuning members connected in series with an intermediate first fixed capacitive member, a second fixed capacitive member shunted across said second variable resistance tuning member, said first and second fixed capacitive members each comprising a plurality of fixed capacitors having predetermined values, said capacitors being selectively adapted for individual connection into said tuning circuit, switching means for effecting the selected connection of said capacitors, said first and second variable resistance tuning members each comprising a pair of tuning resistance circuits, said tuning resistance circuits each including at least a potentiometer and a fixed resistance, each of said resistance tuning circuits being selectively adapted for single reversed connection of one alone paralleled by a shunt resistance, for connection of each of said pairs in series, and for connection of each of said pairs in parallel, said fixed resistances, said shunt resistances and said potentiometers having predetermined values so that the minimum tuning resistance for the aforesaid series connection is substantially equal to the maximum tuning resistance for the aforesaid single reversed connection, and so that the minimum tuning resistance for the aforesaid single reversed connection is substantially equal to the maximum tuning resistance for the aforesaid parallel connection, and so that the resistance of each of said tuning resistance circuits may be varied through a predetermined ratio, and second switching means for effecting any selected one of the aforesaid connections to constitute said first and second variable resistance tuning members from said pairs of tuning resistance circuits.

11. A bandspread tuning circuit, comprising, first and second variable resistance tuning members connected in series with an intermediate first fixed capacitive member, a second fixed capacitive member shunted across said second variable resistance tuning member, said first and second fixed capacitive members each comprising a plurality of fixed capacitors having predetermined values, said capacitors being selectively adapted for individual connection into said tuning circuit, switching means for effecting the selected connection of said capacitors, said first and second variable resistance tuning members each comprising a pair of tuning resistance circuits, said tuning resistance circuits each including at least a potentiometer and a fixed resistance, each of said tuning resistance circuits being selectively adapted for single reversed connection of one alone, for connection of each of said pairs in series, and for connection of each of said pairs in parallel, said resistances and said potentiometers having predetermined values so that the minimum tuning resistance for the aforesaid series connection is substantially equal to the maximum tuning resistance for the aforesaid single reversed connection, and second switching means for effecting any selected one of the aforesaid connections to constitute said first and second variable resistance tuning members from said pairs of tuning resistance circuits.

12. A bandspread tuning circuit, comprising, first and second variable resistance tuning members connected in series with an intermediate first fixed capacitive member, a second fixed capacitive member shunted across said second variable resistance tuning member, said first and second fixed capacitive members each comprising a plurality of fixed capacitors having predetermined values, said capacitors being selectively adapted for individual connection into said tuning circuit, switching means for effecting the selected connection of said capacitors, said first and second variable resistance tuning members each comprising a pair of tuning resistance circuits, said tuning resistance circuits each including at least a potentiometer and a fixed resistance, each of said tuning resistance circuits being selectively adapted for single reversed connection of one alone, for connection of each of said pairs in series, and for connection of each of said pairs in parallel, said resistances and said potentiometers having predetermined values so that the minimum tuning resistance for the aforesaid single reversed connection is substantially equal to the maximum tuning resistance for the aforesaid parallel connection, and second switching means for effecting any selected one of the aforesaid connections to constitute said first and second variable resistance tuning members from said pairs of tuning resistance circuits.

13. A band spread tuning circuit, comprising, a variable resistance tuning member associated with a fixed capacitive member, said fixed capacitive member comprising a plurality of fixed capacitors having predetermined values, said capacitors being selectively adapted for individual connection into said tuning circuit, switching means for effecting the selected connection of said capacitors, said variable tuning resistance member comprising a pair of tuning resistance circuits, said tuning resistance circuits each including at least a potentiometer and a fixed resistance, said tuning resistance circuits being selectively adapted for single reversed connection of one alone, for connection of said pair in series, and for connection of said pair in parallel, said fixed resistances and said potentiometers having predetermined values so that the minimum tuning resistance for the aforesaid series connection is substantially equal to the maximum tuning resistance for the aforesaid single reversed connection, and so that the minimum tuning resistance for the aforesaid single reversed connection is substantially equal to the maximum tuning resistance for the aforesaid parallel connection, and second switching means for effecting any selected one of the aforesaid connections to constitute said variable resistance tuning member from said pair of tuning resistance circuits.

14. A band spread tuning circuit, comprising, a variable resistance tuning member associated with a fixed capacitive member, said capacitive member comprising a plurality of fixed capacitors having predetermined values, said capacitors being selectively adapted for individual connection into said tuning circuit, switching means for effecting the selected connection of said capacitors, said variable resistance tuning member comprising a pair of tuning resistance circuits, said tuning resistance circuits each including at least a potentiometer and a fixed resistance, said tuning resistance circuits being selectively adapted for single reversed connection of one alone paralleled by a shunt resistance, for connection of said pair in series, and for connection of said pair in parallel, said fixed resistances, said shunt resistance, and said potentiometers havinng predetermined values so that the minimum tuning resistance for the aforesaid series connection is substantially equal to the maximum tuning resistance for the aforesaid single reversed connection. and so that the minimum tuning resistance for the aforesaid single reversed connection is substantially equal to the maximum tuning resistance for the aforesaid parallel connection, and second switching means for effecting any selected one of the aforesaid connections to constitute said variable resistance tuning member from said pair of tuning resistance circuits.

15. A band spread tuning circuit, comprising, a variable resistance tuning member associated with a fixed capacitive member, said fixed capacitive member comprising a plurality of fixed capacitors having predetermined values, said capacitors being selectively adapted for individual connection into said tuning circuit, switching means for effecting the selected connection of said capacitors, said variable resistance tuning member comprising a pair of tuning resistance circuits, said tuning resistance circuits each including at least a potentiometer and a fixed resistance, said tuning resistance circuits being selectively adapted for single reversed connection of one alone paralleled by a shunt resistance, for connection of said pair in series, and for connection of said pair in parallel with an auxiliary shunt and series resistance, said fixed resistances, said shunt resistance, said auxiliary shunt and series resistances, and said potentiometers having predetermined values so that the minimum tuning resistance for the aforesaid series connection is substantially equal to the maximum tuning resistance for the aforesaid single reversed connection, and so that the minimum tuning resistance for the aforesaid single reversed connection is substantially equal to the maximum tuning resistance for the aforesaid parallel connection, and second switching means for effecting any selected one of the aforesaid connections to constitute said variable resistance tuning member from said pair of tuning resistance circuits.

16. A band spread rheostat, comprising, a pair of tuning resistance circuits each including at least a potentiometer and a fixed resistance, each of said tuning resistance circuits being selectively adapted for single reversed connection of one alone paralleled by a shunt resistance, for connection of said pair in series, and for connection of said pair in parallel with an auxiliary shunt and series resistance, said fixed resistances, said shunt resistance, said auxiliary shunt and series resistances, and said potentiometers having predetermined values so that the minimum resistance of the aforesaid series connection is substantially equal to the maximum resistance of the aforesaid single reversed connection, and so that the minimum resistance of the single reversed connection is substantially equal to the maximum resistance of the aforesaid parallel connection, and switching means for effecting any selected one of the aforesaid connections to constitute said band spread rheostat from said pair of resistance circuits.

17. A band spread tuning circuit, comprising, a variable resistance tuning member associated with a fixed capacitive member, said fixed capacitive member comprising a plurality of fixed capacitors having predetermined values, said capacitors being selectively adapted for individual connection into said tuning circuit, switching means for effecting the selected connection of said capacitors, said variable resistance tuning member comprising a pair of tuning resistance circuits, said tuning resistance circuits each including at least a potentiometer and a fixed resistance, said tuning resistance circuits being selectively adapted for connection of said pair in series and for connection of said pair in parallel with an auxiliary shunt and series resistance, said fixed resistances, said auxiliary shunt and series resistances, and said potentiometers having predetermined values so that the minimum tuning resistance for the aforesaid series connection is substantially equal to the maximum tuning resistance for the aforesaid parallel connection, and second switching means for effecting any selected one of the aforesaid connections to constitute said variable resistance tuning member from said pair of tuning resistance circuits.

18. A band spread rheostat, comprising, a pair of tuning resistance circuits each including at least a potentiometer and a fixed resistance, each of said tuning resistance circuits being selectively adapted for connection of said pair in series, and for connection of said pair in parallel with an auxiliary shunt and series resistance, said fixed resistances, said auxiliary shunt and series resistances, and said potentiometers having predetermined values so that the minimum resistance of the aforesaid series connection is substantially equal to the maximum resistance of the aforesaid parallel connection, and switching means for effecting any selected one of the aforesaid connections to constitute said band spread rheostat from said pair of resistance circuits.

CHRISTIAN F. WEILAND.

No references cited.